US010340371B2

(12) United States Patent
Gaquiere et al.

(10) Patent No.: US 10,340,371 B2
(45) Date of Patent: Jul. 2, 2019

(54) MODULATION DEVICE COMPRISING A NANODIODE

(71) Applicants: CENTRE NATIONAL DE LA RECHERCHE SCIENTIFIQUE, Paris (FR); UNIVERSITE LILLE 1—SCIENCES ET TECHNOLOGIES, Villeneuve d'Ascq (FR)

(72) Inventors: Christophe Pierre Paul Gaquiere, Villeneuve d'Ascq (FR); Guillaume Ducournau, Orchies (FR); Marc Faucher, Lesquin (FR)

(73) Assignees: CENTRE NATIONAL DE LA RECHERCHE SCIENTIFIQUE, Paris (FR); UNIVERSITE LILLE 1—SCIENCES ET TECHNOLOGIES, Villeneuve d'Ascq (FR)

( * ) Notice: Subject to any disclaimer, the term of this patent is extended or adjusted under 35 U.S.C. 154(b) by 0 days.

(21) Appl. No.: 15/537,973

(22) PCT Filed: Dec. 15, 2015

(86) PCT No.: PCT/IB2015/059623
§ 371 (c)(1),
(2) Date: Jun. 20, 2017

(87) PCT Pub. No.: WO2016/103111
PCT Pub. Date: Jun. 30, 2016

(65) Prior Publication Data
US 2017/0352748 A1    Dec. 7, 2017

(30) Foreign Application Priority Data

Dec. 22, 2014   (FR) ...................................... 14 63140

(51) Int. Cl.
*H01L 29/739* (2006.01)
*H01L 29/778* (2006.01)
(Continued)

(52) U.S. Cl.
CPC ...... *H01L 29/7391* (2013.01); *H01L 29/0649* (2013.01); *H01L 29/0657* (2013.01);
(Continued)

(58) Field of Classification Search
CPC . H01L 29/7391; H01L 29/475; H01L 29/401; H01L 29/0665
See application file for complete search history.

(56) References Cited

U.S. PATENT DOCUMENTS

| 7,005,775 B2* | 2/2006 | Wan ...................... B81B 3/0035 310/309 |
| 2008/0130356 A1* | 6/2008 | Song ...................... B82Y 10/00 365/174 |
| 2009/0315017 A1* | 12/2009 | Song ...................... B82Y 10/00 257/24 |

(Continued)

FOREIGN PATENT DOCUMENTS

| WO | 02086973 A2 | 10/2002 |
| WO | 2007072405 A2 | 6/2007 |
| WO | 2014134490 A1 | 9/2014 |

OTHER PUBLICATIONS

Song et al.,"Unidirectional electron flow in a nanometer-scale semiconductor channel: A self-switching device", Applied Physics Letters, pp. 1881-1883, vol. 83, No. 9 (Sep. 2003).
(Continued)

*Primary Examiner* — Dung A. Le
(74) *Attorney, Agent, or Firm* — Browdy and Neimark, P.L.L.C.

(57) ABSTRACT

The invention relates to a modulation device created on a substrate (1), comprising at least one nanodiode in the form of a T fitted into a U, the channel (31) of said nanodiode
(Continued)

being the leg of the T that is inserted into the U. The device is characterized in that it comprises at least one electrically conductive line (37) that passes over at least part of said channel (31).

9 Claims, 1 Drawing Sheet

(51) Int. Cl.
  *H01L 29/06* (2006.01)
  *H01L 29/20* (2006.01)
  *H01L 29/205* (2006.01)
  *H01L 29/40* (2006.01)
  *H01L 29/47* (2006.01)

(52) U.S. Cl.
  CPC ...... *H01L 29/0665* (2013.01); *H01L 29/2003* (2013.01); *H01L 29/205* (2013.01); *H01L 29/401* (2013.01); *H01L 29/475* (2013.01); *H01L 29/7786* (2013.01)

(56) References Cited

U.S. PATENT DOCUMENTS

| | | | | |
|---|---|---|---|---|
| 2012/0261708 | A1* | 10/2012 | Xie | H01L 33/20 257/98 |
| 2014/0217509 | A1* | 8/2014 | Chang | H01L 29/66545 257/350 |
| 2015/0263043 | A1* | 9/2015 | Chen | H01L 27/124 257/72 |

OTHER PUBLICATIONS

Sangare et al.,"Zero-bias GaN implanted Self-Switching Diode coupled with bow-tie antenna for THz applications", 2014 44th European Microwave Conference, European Microwave Association, pp. 806-809 (Oct. 2014).

Mateos et al.,"Noise and Terahertz rectification in semiconductor diodes and transistor", Noise and Fluctuations (1CNF), pp. 16-21 (Jun. 2011).

Sanchez-Martin, et al., Voltage controlled sub-Thz detection with gated planar asymmetric nanochannels, Applied Physics Letters, 2018, pp. 043504-2-043504-4, vol. 113.

* cited by examiner

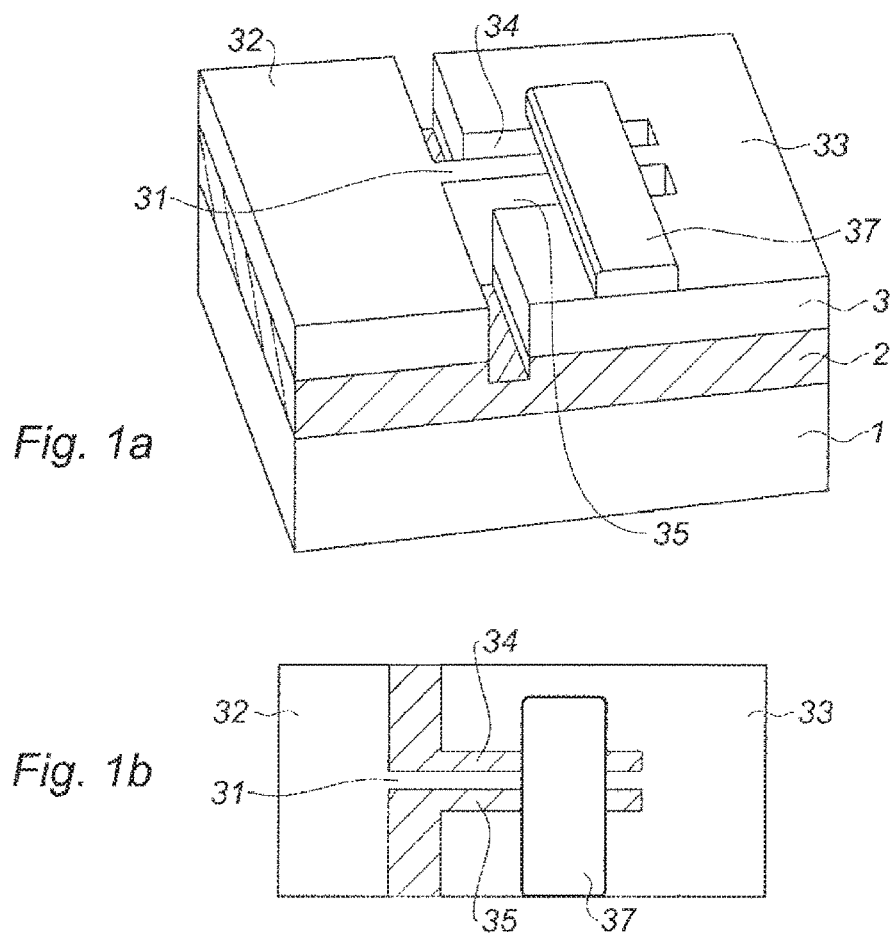
Fig. 1a
Fig. 1b
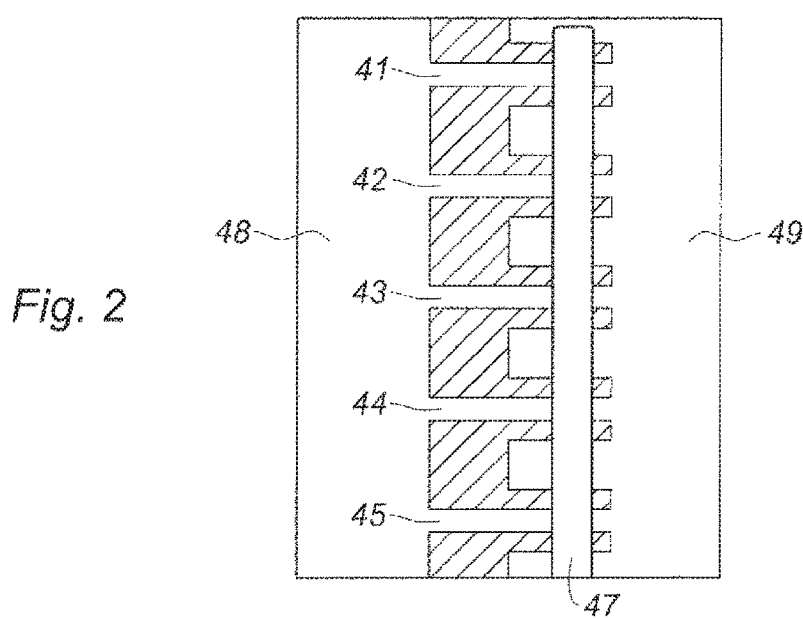
Fig. 2

MODULATION DEVICE COMPRISING A NANODIODE

The present invention relates to a modulation device including at least a nano-diode.

The field of the invention is notably that of the detection of a very high frequency, in the range of the order of a terahertz.

Self-switching nano-diodes so called SSD are one of the most promising solutions for attaining this frequency range and thus responding to the multiple applications in development. Indeed, these components require a single nano-lithographic step in order to produce trenches in the semiconductor. Now, such steps are costly and strongly impact the manufacturing yield.

The components are therefore planar: it is thus very easy to associate them in order to produce matrices or detection networks. The substrate used moreover gives the possibility of coupling with suitable optics for terahertz frequencies.

On the subject of nano-diodes, the following article will be mentioned which is incorporated herein by reference:

"Experimental demonstration of direct terahertz detection at room temperature in AlGaN/GaN asymmetric nanochannels" SANGARE P., DUCOURNAU G., GRIMBERT B., BRANDLI V., FAUCHER M., GACQUIERE C., INIGUEZ-DE-LA-TORRE A., INIGUEZ-DE-LA-TORRE I., MILLITHALER J. F., MATEOS J., GONZALES T.—Journal of Applied Physics 1/3, 3 (2013) page 034305 and the following.

The quality of a detector may be evaluated by its detection sensitivity. Further, in order to improve the signal-to-noise ratio produced by detectors in general and with nano-diodes in particular, a known solution consists of using a mechanical chopper, which chops (modulate) the signal which has to be detected. The difficulty related to this solution lies in the use of an external mechanical component to the component, which is bulky, impossible to integrate and which limits the chopping frequency to a few thousand of hertz (<10,000 Hz in general).

The object of the present invention is thereby to increase the signal-to-noise ratio of a detection device with nano-diodes without resorting to a mechanical chopper.

According to the invention, a modulation device is made on a substrate including at least a nano-diode which appears like a T fitted into a U, the channel of this nano-diode being the leg of the T which penetrates into U; this device is remarkable in that it includes at least one electrically conducting line which passes over at least a portion of this channel.

Advantageously, the device including a plurality of juxtaposed nano-diodes, the line passes over the totality of the channels.

Optionally, a layer of a dielectric material is interposed between the channel(s) and the line.

According to a preferential embodiment, the substrate is in silicon.

Preferably, the nano-diode(s) are formed in a AlGaN/GaN heterostructure.

As an example, the line is made with a mixture of gold and molybdenum or else it is made from a multilayer such as titanium/platinum/gold.

The invention further aims at a method for controlling the device which comprises a step for powering the line.

The present invention will now become apparent with more details within the scope of the description which follows of exemplary embodiments given as an illustration with reference to the appended figures which represent:

FIG. 1, an elementary nano-diode according to the invention, more particularly:
FIG. 1a, a perspective diagram,
FIG. 1b, a top view;
FIG. 2, a set of nano-diodes according to the invention.

The elements present in several figures are affected with a single and same reference.

With reference to FIG. 1, a nano-diode is etched in a bilayer heterostructure deposited on a substrate 1 which is in silicon in the present case.

The heterostructure includes a lower layer 2 in contact with the substrate and an upper layer 3.

As an example, the lower layer 2 is in GaN and the upper layer 3 is in $Al_{0.3}Ga_{0.7}N$.

The nano-diode is etched in the upper layer 3.

It appears like a T, on the left of the figure, fitted into a U, on the right of the figure. The leg 31 of the T which substantially is supported at the middle of the bar 32 of this T opens into the base 33 of the U. It forms the channel of the diode which therefore extends from the bar 32 as far as the base 33. On either side of the channel 31 appear two trenches 34, 35 which extends for forming a free space between the bar 32 of the T and the top of the U.

A conductive line 37 is arranged on the channel 31, perpendicularly to the latter and it rests on both uprights of the U. As an example, in order to produce this line, one begins by depositing a thin layer of metal on the diode and then this layer will be etched.

The line may be a mixture of gold and of molybdenum. It may also consist in a titanium-platinum-gold tri-layer. In any case, regardless of its constitution, the important point is that this line is electrically conductive.

A Schottky contact is thereby made between the line 37 and the channel 31.

Moreover depositing a layer of dielectric material may moreover be contemplated between the nano-diode and the line.

A single nano-diode can only transmit a very limited current because of the section of its channel. Juxtaposition of a plurality of nano-diodes is thereby known.

With reference to FIG. 2, a set of five nano-diodes is illustrated which therefore have five channels 41, 42, 43, 44, 45 opening into a left access area 48 and a right access area 49.

Now, the conductive line 47 passes over the totality of the channels.

The connections are not illustrated in the figures in order not to burden them. Further, they are well known to one skilled in the art who has no difficulty for making them.

The function of the line is that of a switch for which the state depends on the applied voltage to this line.

The switch is open when a negative voltage of the order of 5 volts is applied. It is closed when a zero or slightly positive voltage is applied.

Thus advantageously, the "chopper" is thereby replaced for improving the signal-to-noise ratio by controlling the line in an all or nothing mode.

Further, it is possible to adjust the voltage on the line in the conducting mode in order to have a much higher sensitivity than for a nano-diode without any line. It is possible to obtain a factor comprised between 10 and 100 for a positive voltage of the order of 0.6 volts.

In fact, the function of the line may be assimilated with that of the gate of a transistor.

The consequence thereof is that the line may be used not only in an all or nothing mode but also as a modulator of the current which flows in the channel.

The present invention has been shown according to particularly relevant embodiments. However, many alternatives may be devised by one skilled in the art without leaving the scope of this invention. In particular, any described means may be replaced with an equivalent means.

The invention claimed is:

1. A modulation device made on a substrate including at least one nanodiode which appears as T fitted into a U, a channel of this nanodiode being a leg of the T which penetrates into the U, characterized in that it includes at least one electrically conductive line which passes over at least one portion of this channel thereby forming a switch.

2. The device according to claim 1, characterized in that, including a plurality of juxtaposed nanodiodes, said line steps over the totality of the channels.

3. The device according to claim 1, characterized in that said substrate is in silicon.

4. The device according to claim 1, characterized in that the nanodiode(s) is(are) formed in a AlGaN/GaN heterostructure.

5. The device according to claim 1, characterized in that said line is made with a mixture of gold and of molybdenum.

6. The device according to claim 1, characterized in that said line is made from a conductive multilayer.

7. The device according to claim 6, characterized in that said conductive multilayer is made in titanium/platinum/gold.

8. A method for controlling the device according to claim 1, characterized in that it comprises a step for powering said line.

9. A modulation device made on a substrate including at least one nanodiode which appears as T fitted into a U, a channel of this nanodiode being a leg of the T which penetrates into the U, characterized in that it includes at least one electrically conductive line which passes over at least one portion of this channel, and a layer of dielectric material is interposed between the channel(s) and said line.

* * * * *